US008211788B2

(12) United States Patent
Chang et al.

(10) Patent No.: US 8,211,788 B2
(45) Date of Patent: Jul. 3, 2012

(54) METHOD OF FABRICATING BONDING STRUCTURE

(75) Inventors: Shyh-Ming Chang, Hsinchu (TW); Sheng-Shu Yang, Hsinchu (TW)

(73) Assignees: Taiwan TFT LCD Association, Hsinchu (TW); Chunghwa Picture Tubes, Ltd., Taoyuan (TW); Au Optronics Corporation, Hsinchu (TW); Hannstar Display Corporation, New Taipei (TW); Chi Mei Optoelectronics Corporation, Tainan County (TW); Industrial Technology Research, Hsinchu (TW); TPO Displays Corp., Miao-Li County (TW)

( * ) Notice: Subject to any disclaimer, the term of this patent is extended or adjusted under 35 U.S.C. 154(b) by 616 days.

(21) Appl. No.: 12/486,771

(22) Filed: Jun. 18, 2009

(65) Prior Publication Data

US 2009/0253233 A1  Oct. 8, 2009

Related U.S. Application Data

(62) Division of application No. 11/669,160, filed on Jan. 31, 2007, now Pat. No. 7,576,430.

(30) Foreign Application Priority Data

Oct. 26, 2006 (TW) .............................. 95139501 A

(51) Int. Cl.
  *H01L 21/44* (2006.01)
(52) U.S. Cl. . 438/613; 438/107; 257/738; 257/E23.021; 257/E21.508; 257/E23.069
(58) Field of Classification Search .................. 257/737, 257/738, E21.508, E23.021, E23.069; 438/106, 438/107, 118, 119, 613
See application file for complete search history.

(56) References Cited

U.S. PATENT DOCUMENTS

| | | | | |
|---|---|---|---|---|
| 4,545,610 | A * | 10/1985 | Lakritz et al. | 438/125 |
| 5,056,216 | A * | 10/1991 | Madou et al. | 29/843 |
| 5,578,527 | A | 11/1996 | Chang et al. | |
| 5,700,715 | A * | 12/1997 | Pasch | 438/613 |
| 6,916,185 | B2 * | 7/2005 | Hedler et al. | 439/83 |
| 7,041,589 | B2 | 5/2006 | Lay et al. | |

FOREIGN PATENT DOCUMENTS

| | | |
|---|---|---|
| TW | 200516678 | 5/2005 |
| TW | 200541068 | 12/2005 |

OTHER PUBLICATIONS

"Office Action of Taiwan Counterpart Application", issued on Feb. 23, 2011, p. 1-p. 8.

* cited by examiner

*Primary Examiner* — David Vu
(74) *Attorney, Agent, or Firm* — Jianq Chyun IP Office

(57) ABSTRACT

A method of fabricating a bonding structure having compliant bumps includes first providing a first substrate and a second substrate. The first substrate includes first bonding pads. The second substrate is disposed on one side of the first substrate and includes second bonding pads and compliant bumps disposed thereon. The second bonding pads are opposite to the first bonding pads. Next, a non-conductive adhesive layer and ball-shaped spacers are formed between the first and the second substrates. Finally, the first substrate, the non-conductive adhesive layer, and the second substrate are compressed, such that the compliant bumps on the second bonding pads of the second substrate pass through the non-conductive adhesive layer and are electrically connected to the first bonding pads of the first substrate, respectively. The ball-shaped spacers are distributed in the non-conductive adhesive layer sandwiched between the first and the second substrates for maintaining the gap therebetween.

8 Claims, 8 Drawing Sheets

METHOD OF FABRICATING BONDING STRUCTURE

CROSS-REFERENCE TO RELATED APPLICATION

This application a divisional of and claims priority benefit of an application Ser. No. 11/669,160, filed on Jan. 31, 2007, now allowed, which claims the priority benefit of Taiwan application serial no. 95139501, filed on Oct. 26, 2006. The entirety of each of the above-mentioned patent applications is hereby incorporated by reference herein and made a part of this specification.

BACKGROUND OF THE INVENTION

1. Field of the Invention

The present invention relates to a method of fabricating a bonding structure, and more particularly to a method of fabricating a bonding structure using a non-conductive adhesive layer as a bonding medium.

2. Description of Related Art

With rapid advancement in the liquid crystal display (LCD) technology, the new generation of LCDs with advantages of high brightness, wide viewing angle, fast responding speed, high resolution, and full-colors has been developing. The quality of the displayed images is determined by structures of liquid crystal molecules, physical characteristics of pixel electrodes, color filters, a process of manufacturing thin film transistors (TFTs), alignment layers, a material of a sealant, post-end packaging technologies, and so forth. With the demand for high resolution LCDs and for light and compact electronic devices, the packaging technology evolving from a chip-on-board (COB) bonding technology to a tape-automated-bonding (TAB) technology is now advanced to a fine-pitch chip-on-glass (COG) bonding technology.

In the most common COG bonding process uses an anisotropic conductive film as a medium through which a driver IC and a LCD panel are electrically connected to each other. First of all, the anisotropic conductive film is disposed on the driver IC bonding region of the LCD. Then, the driver IC is compressed onto the anisotropic conductive film through a process of heating and pressurizing, such that the bumps on the driver IC and the bonding pads on the LCD panel are electrically conducted through conductive particles of the anisotropic conductive film. However, when a pitch between two adjoining bumps is relatively small, the conductive particles of the anisotropic conductive film easily result in short circuit of the bumps, thus limiting the miniaturization of the gap between the chip and the glass.

In order to solve the aforementioned problem, a non-conductive film (NCF) is proposed to replace said anisotropic conductive film, so as to meet the requirement of ultra high-density bonding. Nevertheless, there is a significant difference between the coefficient of thermal expansion (CTE) of the NCF and that of the chip and the glass substrate. Accordingly, after the COG bonding process is completed, the chip and the glass substrate are prone to micro-delamination, and structural micro-cracks or structural micro voids further pose a great impact on reliability of contacts.

FIG. 1 is a schematic cross-sectional view illustrating a conventional bonding structure. Please refer to FIG. 1. The bonding structure 100 mainly includes a first substrate 110 and a second substrate 120. The first substrate 110 includes a plurality of first bonding pads 112 and bumps 114 disposed thereon. Likewise, the second substrate 120 includes a plurality of second bonding pads 122 and bumps 124 disposed thereon. The second bonding pads 122 are opposite to the first bonding pads 112. As a reflow process is performed on the substrates, the bumps 114 and 124 are fused together, such that the first substrate 110 is electrically connected to the second substrate 120. One of the technical features of the bonding structure 100 lies in that a metal layer 116, 126 with a high melting point is disposed in the metal layer below the bumps 114 and 124. The metal layer 116, 126 is composed of aurum (Au), for example. Thereby, the unmelted metal layer 116, 126 provides a desirable support during the reflow process.

FIGS. 2A and 2B are schematic cross-sectional views illustrating a conventional COG bonding process. First, referring to FIG. 2A, a substrate 210 and a chip 220 opposite thereto are provided. Several corresponding bumps 212, 222 are then disposed on the glass substrate 210 and the chip 220. In addition, several stud bumps 224 with a high melting point metal are further disposed on the chip 220. The stud bumps 224 are composed of Au, for example. Please refer to FIG. 2B. As the reflow process is carried out, the bumps 212 and 222 fuse together, such that the substrate 210 is electrically connected to the chip 220. Moreover, during the reflow process, the stud bumps 224 is adapted to support the whole chip 220, so as to maintain the gap between the substrate 210 and the chip 220.

Furthermore, a "bonding structure with compliant bumps" is disclosed in U.S. Pat. No. 6,972,490. Referring to FIG. 3, the bonding structure 300 mainly includes a first substrate 310, a second substrate 320, and a non-conductive adhesive layer 330 sandwiched between the first and the second substrates. A compliant bump 314 is respectively disposed on each of the metal bonding pads 312 on the first substrate 310, such that the metal bonding pads 312 are electrically connected to the metal bonding pads 322 on the second substrate 320 through the compliant bump 314. One of the technical features of the bonding structure 300 lies in that several stoppers 316 are simultaneously formed while several tapered bumps 314a are formed within the compliant bumps 314. Thereby, the stoppers 316 are used to prevent the compliant bumps 314 from cracking due to overpressure in the COG bonding process, thus leading to conductance of the contacts.

SUMMARY OF THE INVENTION

The present invention provides a method of fabricating a bonding structure having a plurality of compliant bumps. The method includes the following steps: first, a first substrate and a second substrate are provided. The first substrate includes a plurality of first bonding pads. The second substrate is disposed on one side of the first substrate and includes a plurality of second bonding pads and the compliant bumps disposed thereon. The second bonding pads are opposite to the first bonding pads. Next, a non-conductive adhesive layer and a plurality of ball-shaped spacers are formed between the first and the second substrates. Finally, the first substrate, the non-conductive adhesive layer, and the second substrate are compressed, such that the compliant bumps on the second bonding pads of the second substrate pass through the non-conductive adhesive layer and are electrically connected to the first bonding pads of the first substrate, respectively. In particular, the ball-shaped spacers are distributed in the non-conductive adhesive layer sandwiched between the first and the second substrates for maintaining the gap therebetween.

DESCRIPTION OF EMBODIMENTS

Figure 1:
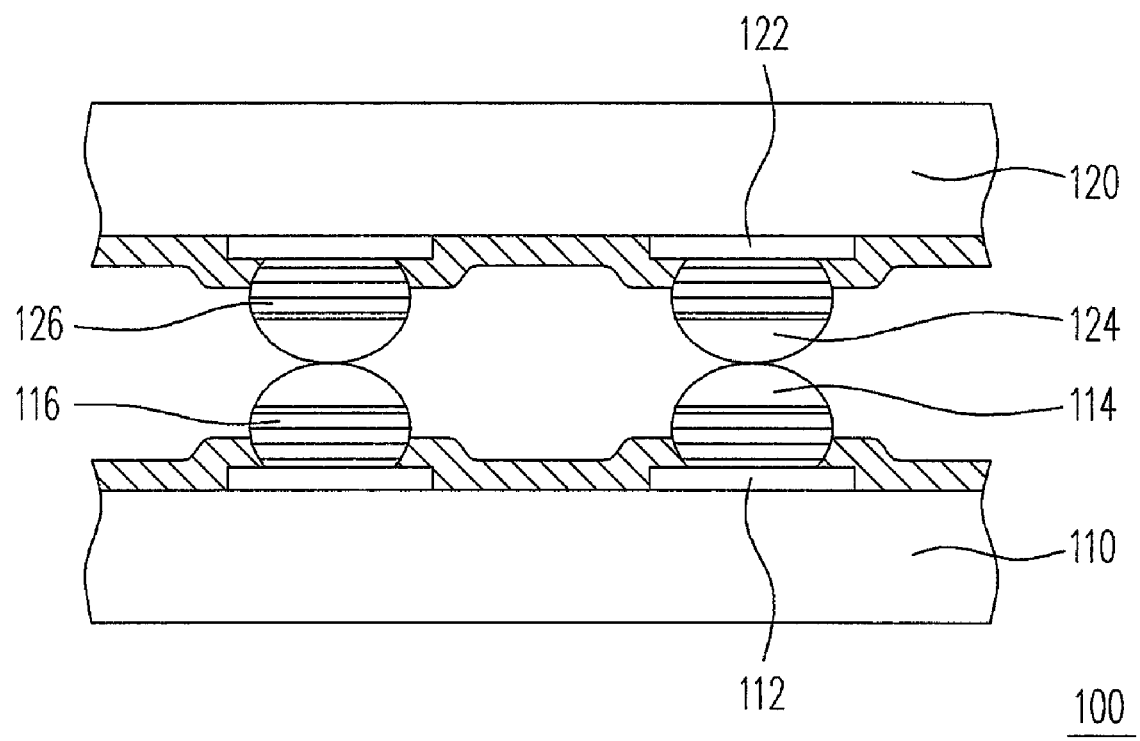
FIG. 1 is a schematic cross-sectional view illustrating a conventional bonding structure.
Figure 2A:
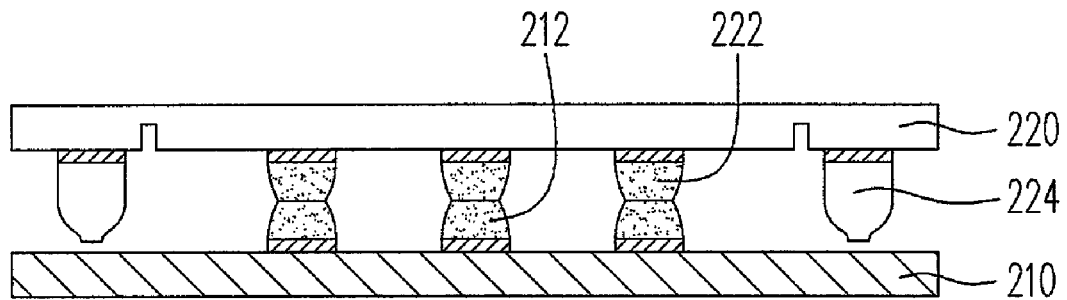
FIGS. 2A and 2B are schematic cross-sectional views illustrating a process of fabricating a conventional bonding structure.
Figure 2B:
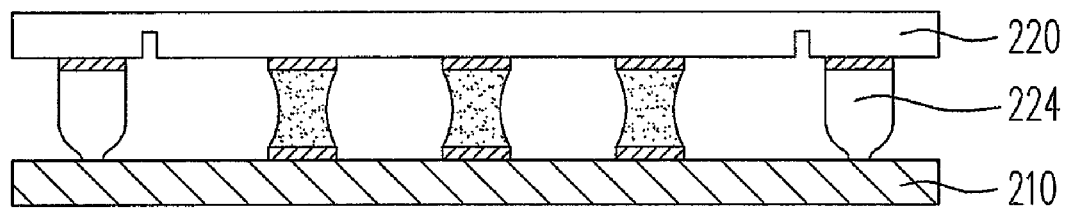
Figure 3:
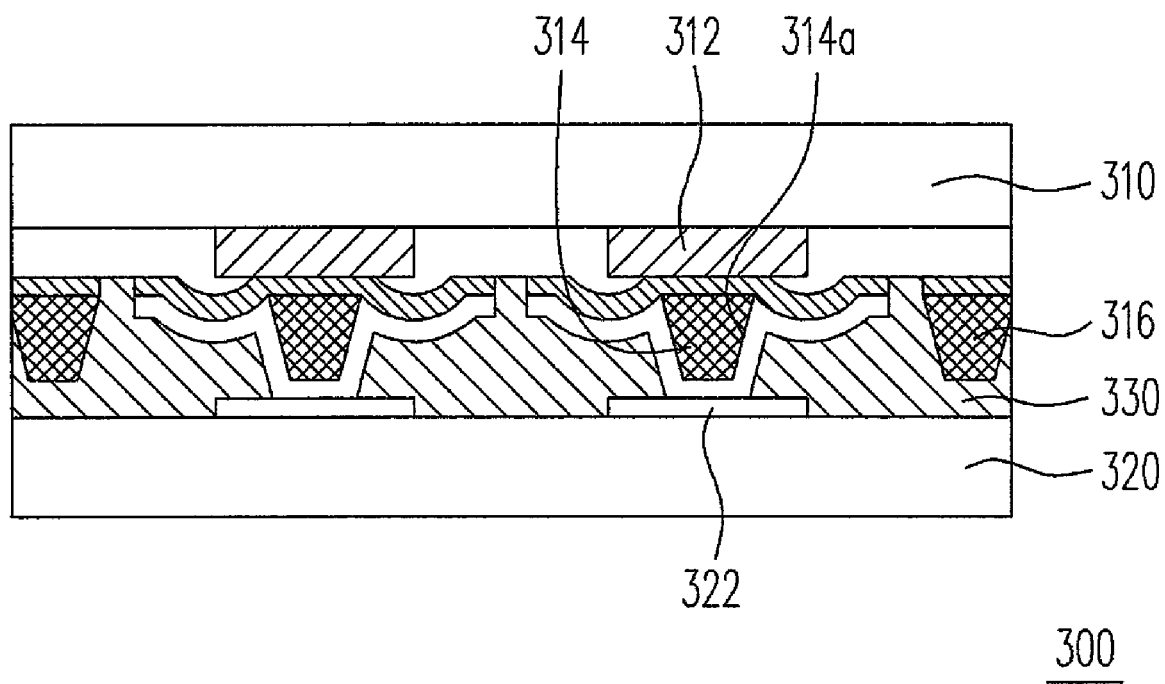
FIG. 3 is a schematic cross-sectional view illustrating a bonding structure incorporating compliant bumps as disclosed in U.S. Pat. No. 6,972,490.
Figure 4A:
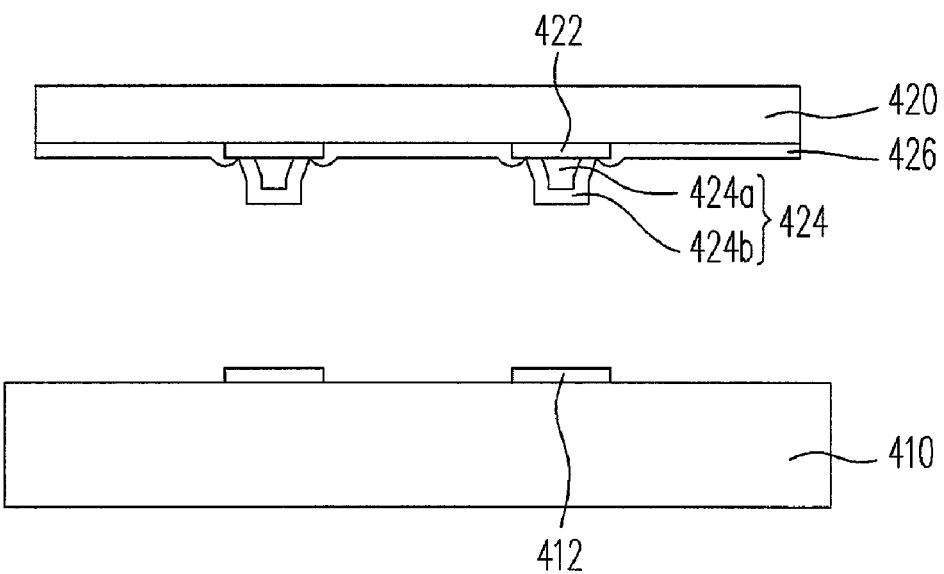
FIGS. 4A to 4C are schematic cross-sectional views illustrating a method of fabricating a bonding structure having compliant bumps according to an embodiment of the present invention.
Figure 4B:
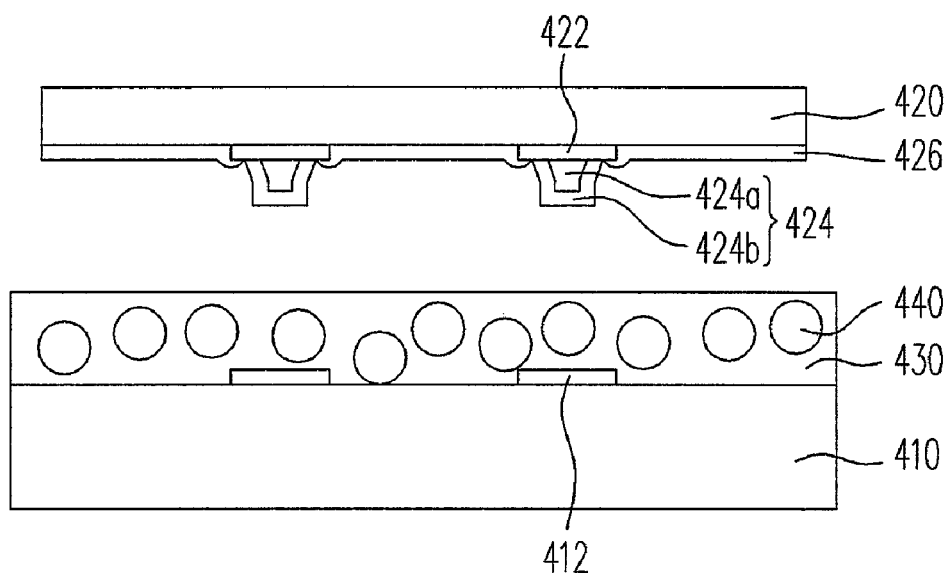
Figure 4C:
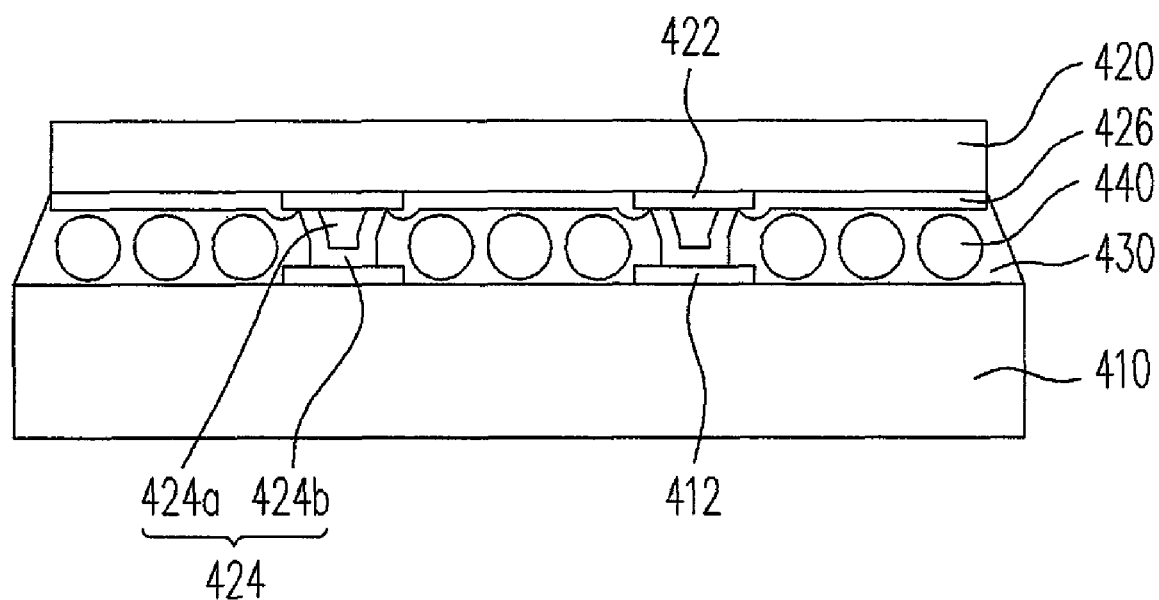

FIGS. 4A to 4C are schematic cross-sectional views illustrating a method of fabricating a bonding structure having compliant bumps according to an embodiment of the present invention. Referring to FIG. 4A, a first substrate 410 and a second substrate 420 are provided. The first substrate 410 includes a plurality of first bonding pads 412. The second substrate 420 is disposed on the first substrate 410 and includes a plurality of second bonding pads 422 and a plurality of compliant bumps 424 disposed thereon. The second bonding pads 422 are opposite to the first bonding pads 412.

This embodiment is exemplified with a COG bonding process. Hence, the first substrate 410 is a glass substrate, and the second substrate 420 is a chip. However, the first substrate 410 can also be a silicon substrate, a printed circuit board, a flexible circuit board, or a ceramic substrate, while the second substrate 420 can be a silicon substrate, a glass substrate, a printed circuit board, or a flexible circuit board. The materials of the first substrate 410 and the second substrate 420 are not limited to those described in the present invention. Besides, each of the compliant bumps 424 disposed on the second bonding pads 422 of the second substrate 420 include a elastic polymer bump 424a and a conductive metal layer 424b covering the polymer bump 424a. Moreover, a passivation layer 426 is, in most cases, formed on the second substrate 420. The passivation layer 426 exposes the second bonding pads 422 and prevents the circuits in the substrates from humidity or damage.

Figure 5A:
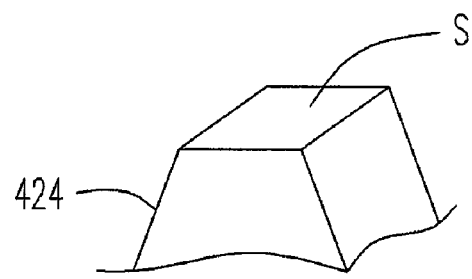
FIG. 5A is a perspective schematic view illustrating the compliant bumps indicated in FIG. 4A.
Figure 5B:
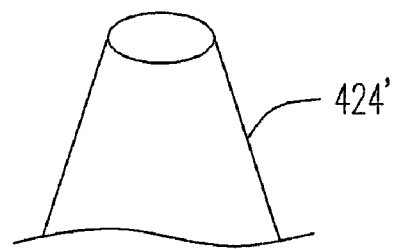
FIGS. 5B to 5E are perspective schematic views illustrating other type of the compliant bumps, respectively.
Figure 5C:
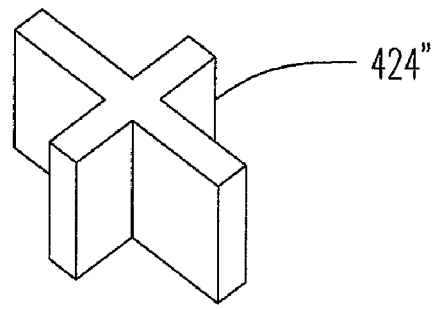
Figure 5D:
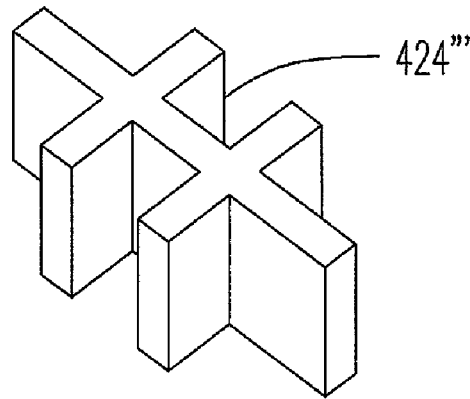
Figure 5E:
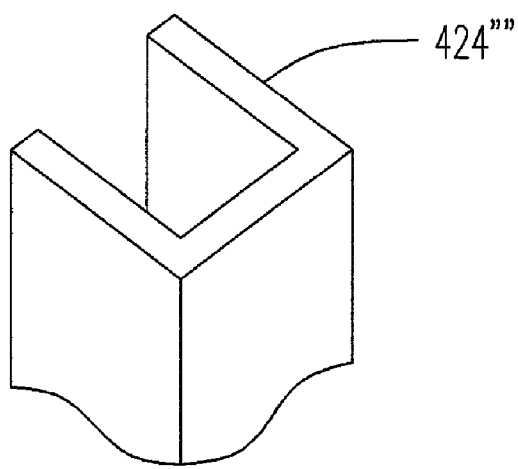

According to the present embodiment, each of the compliant bumps 424 is a taper with a rectangular cross-section, and a top surface S of each of the compliant bumps 424 is in contact with each of the first bonding pads 412. FIGS. 5B to 5E are perspective schematic views illustrating other types of the compliant bumps, respectively. In FIG. 5B, the compliant bump 424' is a taper with a circular cross-section. In FIG. 5C, the compliant bump 424" is a pillar with a cross-shaped cross-section. In FIG. 5D, the compliant bump 424''' is a pillar with a double-cross cross-section. In FIG. 5E, the compliant bump 424'''' is a pillar with a U-shaped cross-section. Aside from the compliant bumps 424 as are listed above, the compliant bumps 424 can also be of other shapes as well. The geometric appearances of the compliant bumps 424 are not limited to those described in the present invention.

Next, referring to FIG. 4B, a non-conductive adhesive layer 430 and a plurality of ball-shaped spacers 440 are formed between the first substrate 410 and the second substrate 420. According to the present embodiment, the ball-shaped spacers 440 are firstly distributed in the non-conductive adhesive layer 430, and the non-conductive adhesive layer 430 having the ball-shaped spacers 440 distributed therein is attached to the first substrate 410 and covers the first bonding pads 412 thereon. The non-conductive adhesive layer 430 includes a non-conductive paste (NCP) or a non-conductive film (NCF) in the present embodiment. Besides, the ball-shaped spacers 440 distributed in the non-conductive adhesive layer 430 should be made of an insulating material, so as to prevent abnormal electrical conductance between the first substrate 410 and the second substrate 420. The insulating material can be an organic material or an inorganic material. To be more specific, the organic material includes a polymer e.g. epoxy resin or polyimide, while the inorganic material includes $SiO_2$ or $TiO_2$.

In the successive process of compressing the first substrate 410 and the second substrate 420, the ball-shaped spacers 440 may lodge between the compliant bumps 424 of the second substrate 420 and the first bonding pads 412 of the first substrate 410, thus obstructing normal electrical conductance between the first substrate 410 and the second substrate 420. To prevent development of said situation, each of the compliant bumps 424 is designed to be that in the cross-section of each compliant bump 424 parallel to the surface of the first substrate 410, the length of the narrowest edge of each of the compliant bumps 424 is smaller than the diameter of each of the ball-shaped spacers 440. Hence, through the narrowest edge of each of the compliant bumps 424, the ball-shaped spacers 440 can be excluded in the successive process of compressing the first substrate 410 and the second substrate 420, thus preventing the ball-shaped spacers 440 from lodging between the compliant bumps 424 and the first bonding pads 412. Moreover, the height of each of the compliant bumps 424 exceeds the diameter of each of the ball-shaped spacers 440, so as to prevent the compliant bumps 424 from being unable to electrically contact the first bonding pads 412 after the first substrate 410 and the second substrate 420 are compressed to each other.

Finally, please refer to FIG. 4C. The first substrate 410, the non-conductive adhesive layer 430 and the second substrate 420 are compressed to one another, such that the compliant bumps 424 on the second bonding pads 422 of the second substrate 420 pass through the non-conductive adhesive layer 430 and are electrically connected to the first bonding pads 412 of the first substrate 410, respectively. The process of fabricating the bonding structure 400 is thus completed. In the bonding structure 400, the ball-shaped spacers 440 are distributed in the non-conductive adhesive layer 430 to maintain the gap between the first substrate 410 and the second substrate 420. Thereby, the maintained gap prevents the compliant bumps 430 from cracking due to overpressure in the process of bonding the first substrate 410 and the second substrate 420. More specifically, the method of compressing the first substrate 410, the non-conductive adhesive layer 430 and the second substrate 420 includes a thermal bonding process, an ultraviolet-light illuminating bonding process, an ultrasonic-wave bonding process, or any combination thereof.

In said process of forming the non-conductive adhesive layer 430 and a plurality of the ball-shaped spacers 440 between the first substrate 410 and the second substrate 420, as shown in FIG. 4B, the non-conductive adhesive layer 430 having the ball-shaped spacers 440 distributed therein is attached to the first substrate 410 and covers the first bonding pads 412. This process can also be achieved through other ways as are provided hereinafter.

Figure 6:
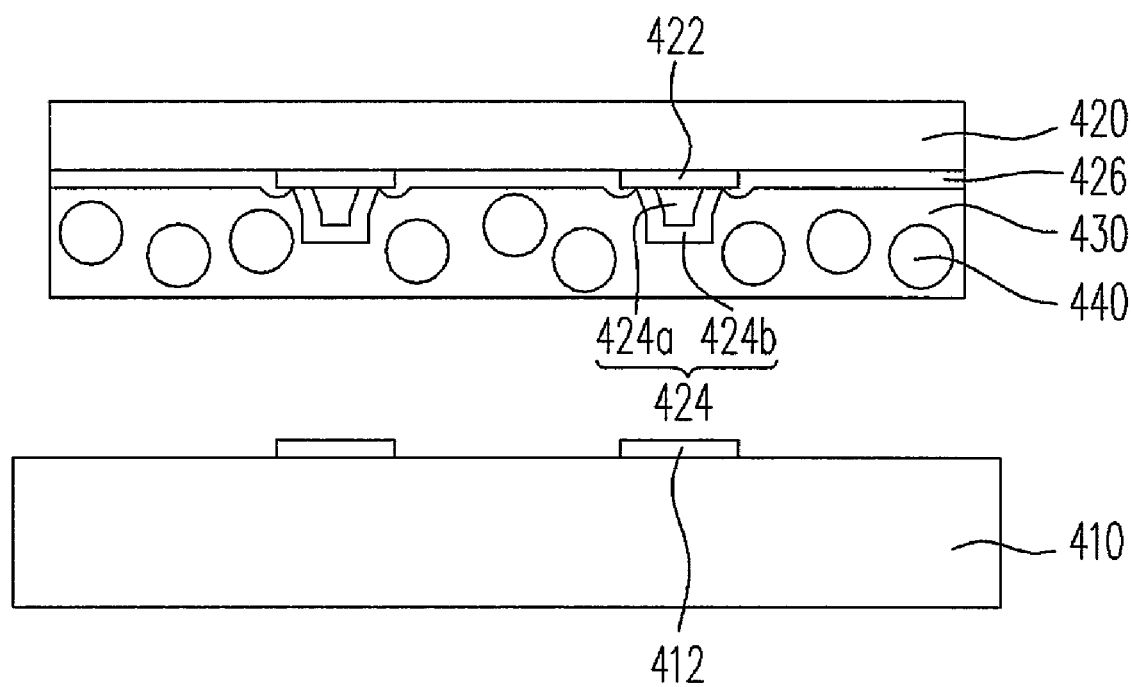
FIG. 6 is a schematic cross-sectional view illustrating one of the methods of forming a non-conductive adhesive layer and ball-shaped spacers between the first and the second substrates.

FIG. 6 is a schematic cross-sectional view illustrating one of the methods of forming the non-conductive adhesive layer and the ball-shaped spacers between the first and the second substrates. Please refer to FIG. 6. Said method similarly includes the following steps: the ball-shaped spacers 440 are firstly distributed in the non-conductive adhesive layer 430, and the non-conductive adhesive layer 430 having the ball-shaped spacers 440 distributed therein is attached to the second substrate 420 and covers the compliant bumps 424.

Finally, the process of compressing the substrates as shown in FIG. 4C is performed to form the bonding structure 400 of FIG. 4C.

In addition, the non-conductive adhesive layer 430 can also be attached to the first substrate 410 and covers the first bonding pads 412. The ball-shaped spacers 440 are then distributed on the non-conductive adhesive layer 430. Alternatively, the non-conductive adhesive layer 430 can be attached to the second substrate 420 and covers the compliant bumps 424. The ball-shaped spacers 440 are then distributed on the non-conductive adhesive layer 430. All of the methods achieve the formation of the non-conductive adhesive layer 430 and the ball-shaped spacers 440 between the first substrate 410 and the second substrate 420.

In summary, the bonding structure and the method of fabricating the same disclosed in the present invention are of the following advantages.

(1) According to the present invention, a plurality of the ball-shaped spacers are supplied to the non-conductive adhesive layer of the bonding structure. Thereby, the difference between the CTE of the non-conductive adhesive layer and that of the substrates is reduced. The structural micro-delamination arisen from a mere application of the non-conductive adhesive layer provided in the related art can be avoided, and problems of formation of the structural micro-cracks or the micro voids are resolved. Consequently, the advantages of the anisotropic conductive film and the non-conductive adhesive layer are well combined, so as to enhance the quality of the bonding structure.

(2) The bonding structure is capable of maintaining the gap through the ball-shaped spacers, so as to prevent the compliant bumps from cracking due to overpressure in the compressing process.

(3) In the present invention, the length of the narrowest edge of each of the compliant bumps is designated to be smaller than the diameter of each of the spacers when the geometric appearances of the compliant bumps are constructed. Thereby, the narrowest edge of each of the compliant bumps can exclude the ball-shaped spacers in the process of compressing the two substrates, thus leading to conductance of every contact and further to improvement of the bonding structure.

(4) The heat dissipating capacity of the non-conductive adhesive layer can be enhanced by supplying a plurality of the ball-shaped spacers. Thereby, the bonding structure is of a lower temperature than the conventional bonding structure to which simply the non-conductive adhesive layer is employed during operation, thus raising the current efficiency.

(5) The dielectric constant of the non-conductive adhesive layer can be reduced by supplying a plurality of the ball-shaped spacers. Hence, the bonding structure can be applied to high-frequency devices.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a bonding structure comprising a plurality of compliant bumps, the method comprising:
   providing a first substrate and a second substrate, wherein the first substrate comprises a plurality of first bonding pads, and the second substrate is disposed on one side of the first substrate and comprises a plurality of second bonding pads and the compliant bumps disposed thereon, the second bonding pads being opposite to the first bonding pads;
   forming a non-conductive adhesive layer and a plurality of ball-shaped spacers between the first and the second substrates; and
   compressing the first substrate, the non-conductive adhesive layer and the second substrate, such that the compliant bumps on the second bonding pads of the second substrate pass through the non-conductive adhesive layer and are electrically connected to the first bonding pads of the first substrate, wherein the ball-shaped spacers are distributed in the non-conductive adhesive layer sandwiched between the first and the second substrates for keeping the gap therebetween.

2. The method of claim 1, wherein the method of forming the non-conductive adhesive layer and the ball-shaped spacers between the first and the second substrates comprises:
   distributing the ball-shaped spacers in the non-conductive adhesive layer; and
   attaching the non-conductive adhesive layer having the ball-shaped spacers distributed therein to the first substrate, the non-conductive adhesive layer covering the first bonding pads.

3. The method of claim 1, wherein the method of forming the non-conductive adhesive layer and the ball-shaped spacers between the first and the second substrates comprises:
   distributing the ball-shaped spacers in the non-conductive adhesive layer; and
   attaching the non-conductive adhesive layer having the ball-shaped spacers distributed therein to the second substrate, the non-conductive adhesive layer covering the compliant bumps.

4. The method of claim 1, wherein the method of forming the non-conductive adhesive layer and the ball-shaped spacers between the first and the second substrates comprises:
   attaching the non-conductive adhesive layer to the first substrate, the non-conductive adhesive layer covering the first bonding pads; and
   distributing the ball-shaped spacers on the non-conductive adhesive layer.

5. The method of claim 1, wherein the method of forming the non-conductive adhesive layer and the ball-shaped spacers between the first and the second substrates comprises:
   attaching the non-conductive adhesive layer to the second substrate, the non-conductive adhesive layer covering the compliant bumps; and
   distributing the ball-shaped spacers on the non-conductive adhesive layer.

6. The method of claim 1, wherein the method of compressing the first substrate, the non-conductive adhesive layer and the second substrate comprises a thermal bonding process, an ultraviolet-light illuminating bonding process, an ultrasonic-wave bonding process, or a combination thereof.

7. The method of claim 1, wherein in the cross-section of each of the compliant bumps parallel to of a surface of the first substrate, the length of the narrowest edge of each of the compliant bumps is smaller than the diameter of each of the ball-shaped spacers.

8. The method of claim 1, wherein the height of each of the compliant bumps exceeds the diameter of each of the ball-shaped spacers.

* * * * *

UNITED STATES PATENT AND TRADEMARK OFFICE
CERTIFICATE OF CORRECTION

PATENT NO.       : 8,211,788 B2
APPLICATION NO.  : 12/486771
DATED            : July 3, 2012
INVENTOR(S)      : Chang et al.

It is certified that error appears in the above-identified patent and that said Letters Patent is hereby corrected as shown below:

On the cover page of the patent grant, the item (73) Assignee's Name
"Industrial Technology Research" should be changed to --Industrial Technology Research Institute--.

Signed and Sealed this
Twenty-eighth Day of August, 2012

David J. Kappos
*Director of the United States Patent and Trademark Office*